United States Patent
Moriya et al.

(10) Patent No.: US 7,628,864 B2
(45) Date of Patent: Dec. 8, 2009

(54) SUBSTRATE CLEANING APPARATUS AND METHOD

(75) Inventors: Tsuyoshi Moriya, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 358 days.

(21) Appl. No.: 11/115,358

(22) Filed: Apr. 27, 2005

(65) Prior Publication Data

US 2005/0241770 A1 Nov. 3, 2005

Related U.S. Application Data

(60) Provisional application No. 60/589,808, filed on Jul. 22, 2004.

(30) Foreign Application Priority Data

Apr. 28, 2004 (JP) ............................ 2004-134174

(51) Int. Cl.
 *C23F 1/00* (2006.01)
(52) U.S. Cl. ................ 134/1; 134/21; 216/67
(58) Field of Classification Search ................ None
 See application file for complete search history.

(56) References Cited

U.S. PATENT DOCUMENTS

| | | | |
|---|---|---|---|
| 4,962,049 A | 10/1990 | Chang et al. | |
| 5,830,808 A * | 11/1998 | Chapman | 438/729 |
| 6,002,572 A * | 12/1999 | Hirose et al. | 361/213 |
| 6,125,025 A * | 9/2000 | Howald et al. | 361/234 |
| 6,235,640 B1 * | 5/2001 | Ebel et al. | 438/706 |
| 6,379,575 B1 * | 4/2002 | Yin et al. | 216/67 |
| 6,719,886 B2 * | 4/2004 | Drewery et al. | 204/298.18 |
| 2001/0019472 A1 * | 9/2001 | Kanno et al. | 361/234 |
| 2003/0045131 A1 * | 3/2003 | Verbeke et al. | 438/795 |
| 2003/0051665 A1 * | 3/2003 | Zhao et al. | 118/723 E |
| 2003/0066486 A1 * | 4/2003 | Zheng et al. | 118/723 ME |
| 2003/0092264 A1 * | 5/2003 | Kajita et al. | 438/689 |
| 2003/0097987 A1 * | 5/2003 | Fukuda | 118/723 E |
| 2003/0106802 A1 * | 6/2003 | Hagiwara et al. | 205/297 |
| 2004/0020781 A1 * | 2/2004 | Dordi et al. | 205/143 |
| 2004/0071874 A1 * | 4/2004 | Shimizu et al. | 427/248.1 |

(Continued)

FOREIGN PATENT DOCUMENTS

JP 5-175318 7/1993

(Continued)

*Primary Examiner*—Allan Olsen
(74) *Attorney, Agent, or Firm*—Oblon, Spivak, McClelland, Maier & Neustadt, P.C.

(57) ABSTRACT

A substrate cleaning apparatus includes a chamber for accommodating a substrate; a mounting table, disposed in the chamber, for mounting thereon the substrate; an electrode disposed in the mounting table, the substrate being attracted and held on the mounting table as a voltage is applied to the electrode; an exhaust unit for exhausting the inside of the chamber; a separating unit for separating the mounting table and the substrate to form a space therebetween; and a gas supply unit for supplying a gas into the space. While the space is formed, voltages of different polarities are alternately applied to the electrode, the gas supply unit supplies a gas into the space and the exhaust unit exhausts the inside of the chamber. The substrate cleaning apparatus further includes a gas introduction unit for introducing a gas into the chamber while the chamber is depressurized and the space is formed.

12 Claims, 8 Drawing Sheets

U.S. PATENT DOCUMENTS

| | | | |
|---|---|---|---|
| 2004/0079385 A1* | 4/2004 | Frisa et al. | 134/1 |
| 2004/0083976 A1* | 5/2004 | Meyyappan | 118/728 |
| 2004/0206375 A1* | 10/2004 | Ho et al. | 134/26 |
| 2005/0034674 A1* | 2/2005 | Ono | 118/728 |
| 2005/0176252 A1* | 8/2005 | Goodman et al. | 438/692 |
| 2006/0037855 A1* | 2/2006 | Hanson et al. | 204/198 |
| 2006/0051967 A1* | 3/2006 | Chang et al. | 438/710 |

FOREIGN PATENT DOCUMENTS

| | | |
|---|---|---|
| JP | 5-226291 | 9/1993 |
| JP | 10-340884 | 12/1998 |
| JP | 2002-217180 | 8/2002 |
| JP | 2003-60015 | 2/2003 |

* cited by examiner

SUBSTRATE CLEANING APPARATUS AND METHOD

CROSS-REFERENCE TO RELATED APPLICATIONS

This document claims priority to Japanese Patent Application Number 2004-134174, filed Apr. 28, 2004 and U.S. Provisional Application No. 60/589,808, filed Jul. 22, 2004, the entire content of which are hereby incorporated by reference.

FIELD OF THE INVENTION

The present invention relates to a substrate cleaning apparatus and method; and, more particularly, to a substrate cleaning apparatus and method for removing foreign materials attached to a bottom surface of a substrate subject to a plasma processing.

BACKGROUND OF THE INVENTION

Conventionally, in a manufacturing process of a semiconductor device, a processing using a plasma (hereinafter, referred to as "plasma processing"), such as etching or sputtering and CVD (chemical vapor deposition), is performed on a semiconductor wafer (hereinafter, referred to as "wafer") that is an object to be processed.

For example, as shown in FIG. 8, a plasma processing apparatus 80 for performing an etching process includes a cylindrical vessel 81 for containing a wafer; a susceptor 82 disposed in the cylindrical vessel 81, the susceptor 82 serving as a mounting table on which the wafer is mounted; and pusher pins 83 disposed to penetrate through the susceptor 82 toward a surface thereof on which the wafer is mounted (hereinafter, referred to as "mounting surface") The susceptor 82 has in the mounting surface an electrostatic chuck 85 in which an electrode connected to a DC power supply 84 is embedded, and a lower electrode 87 connected to a high frequency power supply 86 is provided in the susceptor 82 (see, e.g., Japanese Patent Laid-open Publication No. 5-226291, FIG. 1).

In the plasma processing apparatus 80, once the wafer on the mounting surface is adsorbed to the electrostatic chuck 85 by an electrostatic adsorptive force, a high frequency power is applied to the lower electrode 87 to generate a high frequency electric field between a top surface in the cylindrical vessel 81 and the susceptor 82, so that a processing gas introduced into the cylindrical vessel 81 is dissociated to generate a plasma. The generated plasma is converged to a top surface of the wafer by a focus ring (not shown) disposed to surround the periphery of the wafer to etch an oxide film and the like formed on the top surface of the wafer.

Further, the wafer subject to the etching process is lifted from the mounting surface by the pusher pins 83, and is unloaded out of the cylindrical vessel 81 by a transfer mechanism such as a scalar arm (not shown) moved therein.

From the plasma produced in the etching process, some parts, which are not converged to the top surface of the wafer, collide with an inner wall of the cylindrical vessel to generate particles. Further, during the etching process, there are produced reaction products. Most of these particles and reaction products are discharged out of the cylindrical vessel by using an exhaust unit (not shown), but some of the particles and/or the reaction products remaining in the cylindrical vessel 81 are deposited on the mounting surface. In addition, particles generated from the susceptor 82 due to the plasma and the like are also deposited on the mounting surface. The particles and/or the reaction products deposited on the mounting surface come to be attached as foreign materials to a bottom surface of a wafer when the wafer is mounted on the mounting surface. As a method for removing the particles and/or the reaction products attached to the bottom surface of the wafer, there has been known a wet cleaning using a cleaning fluid and the like.

Further, as a method without using the cleaning fluid, there has been known a removal method wherein a plasma is generated between the wafer lifted by the pusher pins and the mounting surface and the particles on the bottom surface of the wafer are removed by a sputtering action of ions and/or a chemical reaction of radicals in the generated plasma (see, e.g., column 2, line 67 to column 3, line 17 of U.S. Pat. No. 4,962,049).

However, by repeating the wet cleaning, the cleaning fluid is contaminated. Therefore, in the wet cleaning, the top surface of the wafer tends to be contaminated by, e.g., particles contained in the contaminated cleaning fluid. Further, when the wafer that has been subject to the etching process is loaded in a chamber for a next process, the particles remaining on the wafer may contaminate the inside of the chamber.

Moreover, in case of removing the particles on the bottom surface of the wafer by a plasma, the top surface of the wafer suffers damages owing to an excessive plasma processing due to the plasma generated, i.e., the top surface of the wafer is over-etched due to an excessive etching performed thereon.

SUMMARY OF THE INVENTION

It is, therefore, an object of the present invention to provide a substrate cleaning apparatus and method capable of sufficiently removing foreign materials attached to a bottom surface of a substrate without damaging the substrate.

In accordance with one aspect of the present invention, there is provided a substrate cleaning apparatus including: a chamber for accommodating a substrate; a mounting table, disposed in the chamber, for mounting thereon the substrate; an electrode disposed in the mounting table, the substrate being attracted and held on the mounting table as a voltage is applied to the electrode; an exhaust unit for exhausting the inside of the chamber; a separating unit for separating the mounting table and the substrate to form a space therebetween; and a gas supply unit for supplying a gas into the space, wherein while the space is formed, a voltage is applied to the electrode, the gas supply unit supplies a gas into the space and the exhaust unit exhausts the inside of the chamber.

In accordance with the substrate cleaning apparatus, since a voltage is applied to the electrode disposed in the mounting table while the space is formed between the mounting table and the substrate, an electrostatic field is formed in the space, so that an electrostatic stress is applied on the bottom surface of the substrate. Therefore, foreign materials attached to the bottom surface of the substrate are detached therefrom. Further, since a gas is supplied into the space and the chamber is evacuated while the space is formed, a gas flow is formed in the space and the foreign materials are removed from the space to be discharged out of the chamber by the gas flow. Accordingly, the substrate cleaning apparatus can sufficiently remove the foreign materials attached to the bottom surface of the substrate without damaging the substrate.

Preferably, the substrate cleaning apparatus further includes a gas introduction unit for introducing a gas into the chamber while the chamber is depressurized and the space is formed. With such configurations, since a gas is introduced into the chamber while the chamber is depressurized, a traveling shock wave is generated in the chamber and foreign materials attached to the bottom surface of the substrate are detached into the space by the shock wave. Accordingly, the foreign materials attached to the bottom surface of the substrate can be efficiently removed therefrom without damaging the substrate.

Preferably, the voltage application to the electrode is discontinuously performed. Since the voltage is discontinuously applied to the electrode plate, the voltage application is repeatedly performed, so that an electrostatic stress is applied on the bottom surface of the substrate repeatedly. Accordingly, the foreign materials attached to the bottom surface of the substrate can be more efficiently removed therefrom.

Preferably, voltages of different polarities are alternately applied to the electrode. Since voltages of different polarities are alternately applied to the electrode plate, it is possible to prevent the substrate from being charged. If the substrate is charged, the electrostatic stress being applied on the bottom surface of the substrate by the voltage application becomes reduced. Accordingly, by preventing the substrate from being charged, it is possible to suppress the deterioration in removal efficiency of the foreign materials attached to the bottom surface of the substrate.

Preferably, an absolute value of the voltages is 500 V or greater. Since the voltage of 500 V or greater is applied to the electrode while the space is formed, it is possible to increase the electrostatic stress being applied on the bottom surface of the substrate, ensuring the detachment of the foreign materials.

Preferably, the magnitude of the voltages is 2 kV or greater. Since the magnitude of the voltage is 2 kV or greater, it is possible to further increase the electrostatic stress.

Preferably, the exhaust unit maintains the pressure in the chamber at 133 Pa or greater while the space is formed. Since the exhaust unit maintains the pressure in the chamber at 133 Pa or greater, a viscous flow having a great gas viscosity can be generated in the space. The foreign materials detached from the bottom surface of the substrate are captured by the viscous flow to be discharged together with the gas in the chamber to the outside thereof. Accordingly, the foreign materials attached to the bottom surface of the substrate can be surely removed therefrom.

Preferably, the exhaust unit maintains the pressure in the chamber in a range of $1.33 \times 10^3 \sim 1.33 \times 10^4$ Pa while the space is formed. Accordingly, the viscous flow can be surely generated in the space.

In accordance with another aspect of the present invention, there is provided a substrate cleaning apparatus including: a chamber for accommodating a substrate; a mounting table, disposed in the chamber, for mounting thereon the substrate; an exhaust unit for exhausting the inside of the chamber; a separating unit for separating the mounting table and the substrate to form a space therebetween, the separating unit contacting with the substrate to apply a voltage thereto; a gas supply unit for supplying a gas into the space; and a gas introduction unit for introducing a gas into the chamber, wherein while the space is formed, a voltage is applied to the substrate, the gas supply unit supplies a gas into the space and the exhaust unit exhausts the inside of the chamber; and the gas introduction unit introduces a gas into the chamber while the chamber is depressurized and the space is formed.

In accordance with the substrate cleaning apparatus, since a voltage is applied via the separating unit to the substrate while the space is formed between the mounting table and the substrate, an electrostatic field is formed in the space, so that an electrostatic stress is applied on the bottom surface of the substrate. Therefore, foreign materials attached to the bottom surface of the substrate are detached therefrom. Further, since the gas introduction unit introduces a gas into the chamber while the space is formed and the inside of the chamber is depressurized, a traveling shock wave is generated in the chamber and foreign materials attached to the bottom surface of the substrate are detached into the space by the shock wave. Further, since a gas is supplied into the space and the chamber is evacuated while the space is formed, a gas flow is formed in the space and the foreign materials are removed from the space to be discharged out of the chamber by the gas flow. Accordingly, the substrate cleaning apparatus can sufficiently remove the foreign materials attached to the bottom surface of the substrate without damaging the substrate.

In accordance with still further aspect of the present invention, there is provided a substrate cleaning method for removing foreign materials attached to a bottom surface of a substrate, the method including the steps of: accommodating the substrate in a chamber; mounting the substrate on a mounting table disposed in the chamber; separating the mounting table and the substrate to form a space therebetween; applying a voltage to an electrode disposed in the mounting table while the space is formed; supplying a gas into the space while the space is formed; and exhausting the inside of the chamber while the space is formed.

In accordance with the substrate cleaning method, since a voltage is applied to the electrode plate disposed in the mounting table while the space is formed between the mounting table and the substrate, an electrostatic field is formed in the space, so that an electrostatic stress is applied on the bottom surface of the substrate. Therefore, foreign materials attached to the bottom surface of the substrate are detached therefrom. Further, since a gas is supplied into the space and the chamber is evacuated while the space is formed, a gas flow is formed in the space and the foreign materials are removed from the space to be discharged out of the chamber by the gas flow. Accordingly, the foreign materials attached to the bottom surface of the substrate can be sufficiently removed without damaging the substrate.

Preferably, the substrate cleaning method further including the step of: introducing a gas into the chamber while the chamber is depressurized and the space is formed. In this case, since a gas is introduced into the chamber while the space is formed and the chamber is depressurized, a traveling shock wave is generated in the chamber and foreign materials attached to the bottom surface of the substrate are detached into the space by the shock wave. Accordingly, the foreign materials attached to the bottom surface of the substrate can be efficiently removed therefrom without damaging the substrate.

Preferably, at the voltage applying step, the voltage is discontinuously applied to the electrode. Since the voltage is discontinuously applied to the electrode plate, the voltage application is repeatedly performed, so that an electrostatic stress is applied on the bottom surface of the substrate repeatedly. Accordingly, the foreign materials attached to the bottom surface of the substrate can be more efficiently removed therefrom.

Preferably, at the voltage applying step, voltages of different polarities are alternately applied to the electrode. Since voltages of different polarities are alternately applied to the electrode plate, it is possible to prevent the substrate from being charged. If the substrate is charged, the electrostatic stress being applied on the bottom surface of the substrate by the voltage application will be reduced. Accordingly, by preventing the substrate from being charged, it is possible to suppress the deterioration in removal efficiency of the foreign materials attached to the bottom surface of the substrate.

In accordance with still further aspect of the present invention, there is provided a substrate cleaning method for removing foreign materials attached to a bottom surface of a substrate, the method including the steps of: accommodating the substrate in a chamber; mounting the substrate on a mounting table disposed in the chamber; separating the mounting table and the substrate to form a space therebetween; applying a voltage to the substrate while the space is formed; supplying a gas into the space while the space is formed; exhausting the inside of the chamber while the space is formed; and introducing a gas into the chamber while the chamber is depressurized and the space is formed.

In accordance with the substrate cleaning method, since a voltage is applied via the separating unit to the substrate while the space is formed between the mounting table and the substrate, an electrostatic field is formed in the space, so that an electrostatic stress is applied on the bottom surface of the substrate. Therefore, foreign materials attached to the bottom surface of the substrate are detached therefrom. Further, since a gas is introduced into the chamber while the space is formed and the inside of the chamber is depressurized, a traveling shock wave is generated in the chamber and foreign materials attached to the bottom surface of the substrate are detached into the space by the shock wave. Further, since a gas is supplied into the space and the chamber is evacuated while the space is formed, a gas flow is formed in the space and the foreign materials are removed from the space to be discharged out of the chamber by the gas flow. Accordingly, the foreign materials attached to the bottom surface of the substrate can be sufficiently removed without damaging the substrate.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, preferred embodiments of the present invention will be described with reference to the accompanying drawings.

First, there will be described a plasma processing apparatus as a substrate cleaning apparatus in accordance with a first preferred embodiment of the present invention.

Figure 1:
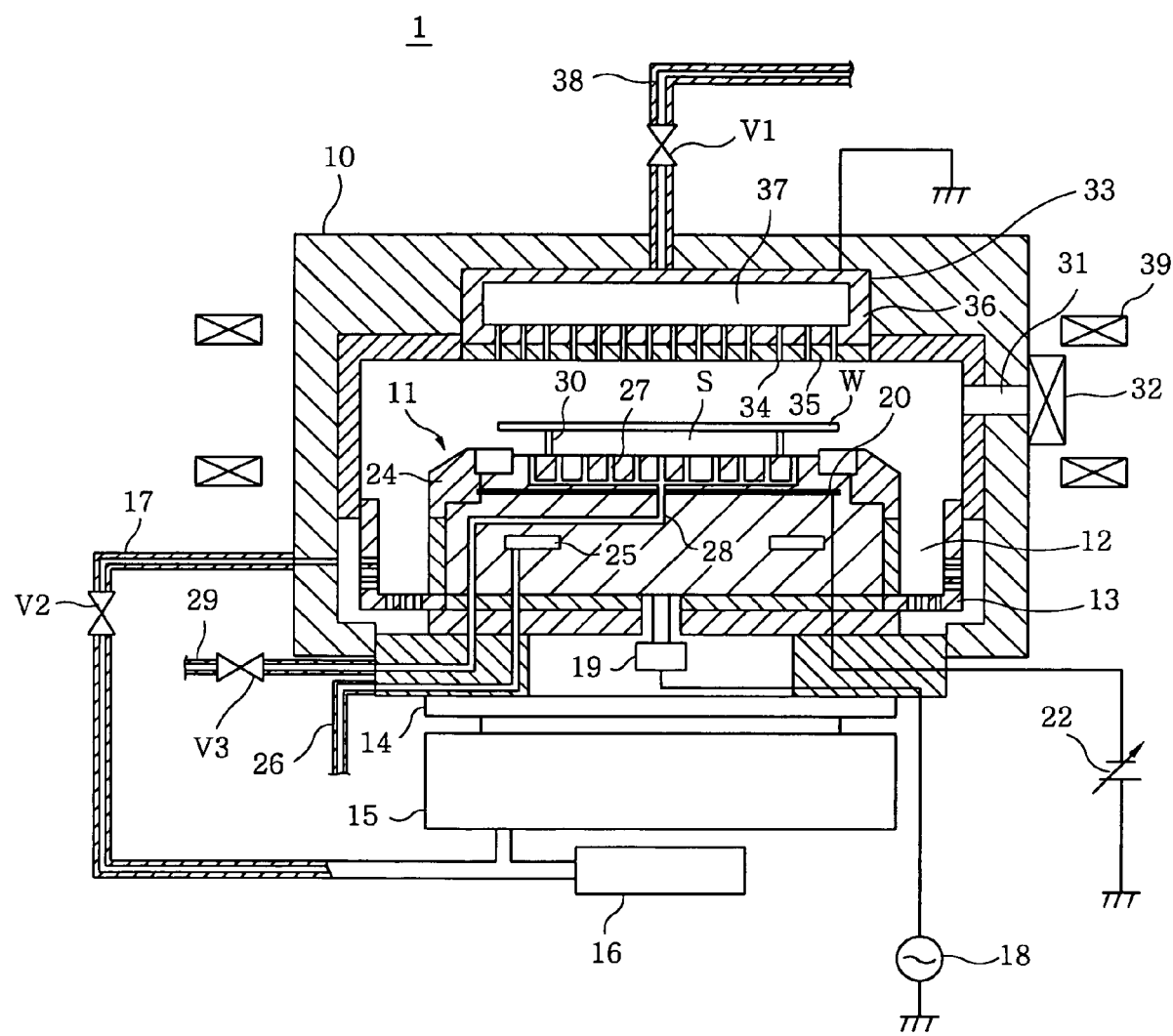
FIG. 1 is a cross sectional view schematically showing configurations of a plasma processing apparatus as a substrate cleaning apparatus in accordance with a first preferred embodiment of the present invention.

FIG. 1 is a cross sectional view schematically showing configurations of the plasma processing apparatus as the substrate cleaning apparatus in accordance with the first preferred embodiment of the present invention.

In FIG. 1, the plasma processing apparatus 1 constructed as an etching processing apparatus for performing an etching process on a wafer W includes a cylindrical chamber (accommodating chamber) 10 made of a metal, e.g., aluminum or stainless steel, and there is provided in the chamber 10 a columnar susceptor (mounting table) 11 as a stage on which the wafer W is mounted.

Formed between a sidewall of the chamber 10 and the susceptor 11 is an exhaust passageway 12 serving as a flow passage through which a gas above the susceptor 11 is discharged out of the chamber 10. An annular baffle plate 13 is provided in the exhaust passageway 12 and a downstream space of the baffle plate 13 in the exhaust passageway 12 is made to communicate with an automatic pressure control valve (hereinafter, referred to as "APC") 14 which is a variable butterfly valve. The APC 14 is connected to a turbo molecular pump (hereinafter, referred to as "TMP") 15 which is an exhaust pump for vacuum suction, and is connected via the TMP 15 to a dry pump 16 (hereinafter, referred to as "DP") which is an exhaust pump. An exhaust line including the APC 14, the TMP 15 and the DP 16 is referred to as a "main exhaust line" hereinafter. The main exhaust line not only controls a pressure in the chamber 10 by using the APC 14 but also depressurizes the inside of the chamber 10 up to an approximately vacuum state by using the TMP 15 and the DP 16.

Further, another exhaust line (hereinafter, referred to as "rough suction line") (exhaust unit), other than the main exhaust line, is connected to the downstream space of the baffle plate 13 in the exhaust passageway 12. The rough suction line includes an exhaust pipe having a diameter of, e.g., 25 mm which allows the downstream space of the baffle plate 13 to communicate with the DP 16, and a valve V2 disposed in the exhaust pipe 17. The valve V2 can block the communication between the downstream space of the baffle plate 13 and the DP 16. A gas in the chamber 10 is discharged through the rough suction line by using DP 16.

A high frequency power supply 18 for generating a plasma is electrically connected to the susceptor 11 via a matching unit 19. The high frequency power supply 18 applies a predetermined high frequency power of, e.g., 13.56 MHz to the susceptor 11. As a result, the susceptor 11 serves as a lower electrode.

Disposed at an upper portion in the susceptor 11 is a disc-shaped electrode plate 20 made of a conductive film for attracting and holding the wafer W by using an electrostatic adsorptive force. A DC power supply 22 is electrically connected to the electrode plate 20.

The wafer W is attracted and held on the top surface of the susceptor 11 by a Coulomb force or a Johnsen-Rahbek force generated by a DC voltage applied to the electrode plate 20 from the DC power supply 22. Further, an annular focus ring 24 made of, e.g., silicon (Si) converges a plasma generated above the susceptor 11 toward the wafer W.

Furthermore, for example, a circumferentially extending annular coolant passageway 25 is provided in the susceptor 11. The coolant passageway 25 is (:"circularly" removed) supplied with a coolant, e.g., cooling water, of a predetermined temperature from a chiller unit (not shown) via a conduit 26, which is to be circulated therethrough, so that the processing temperature of the wafer W on the susceptor 11 is controlled by the temperature of the coolant.

A plurality of thermally conductive gas supply openings (gas supply unit) 27 is opened in a portion of the top surface of the susceptor 11 on which the wafer W is attracted to be held. The thermally conductive gas supply openings 27 communicate via a thermally conductive gas supply line 28 provided in the susceptor 11 with a thermally conductive gas feeding pipe 29 having a valve V3, and a thermally conductive gas, e.g., an He gas, from a thermally conductive gas supply unit (not shown) connected to the thermally conductive gas feeding pipe 29 is supplied to a gap between the top surface of the susceptor 11 and the bottom surface of the wafer W. With such configurations, the heat transfer between the wafer W and the susceptor 11 is enhanced. Further, the valve V3 can block the communication between the thermally conductive gas supply openings 27 and the thermally conductive gas supply unit.

Further, at the portion of the top surface of the susceptor 11 on which the wafer W is attracted to be held, a plurality of pusher pins (separating unit) 30 as lifting pins are disposed to selectively protrude from the top surface of the susceptor 11. In the drawings, the pusher pins 30 are vertically moved by converting a rotation of a motor (not shown) into a linear movement through, e.g., a ball screw. While the wafer is adsorptively held on the top surface of the susceptor 11, the pusher pins 30 are lowered to be accommodated in the susceptor 11. When unloading from the chamber 10 the wafer after being subject to a plasma processing such as the etching processing, the pusher pins 30 protrude from the top surface of the susceptor 11 to lift and separate the wafer W from the susceptor 11. At this time, there is formed a space between the top surface of the susceptor 11 and the bottom surface of the wafer W.

At a sidewall of the chamber 10, there is provided a gate valve 32 for opening and closing a loading/unloading port 31 for the wafer W. Furthermore, at a ceiling portion of the chamber 10, there is provided a shower head 33 as an upper electrode having a ground potential. With such configurations, a high frequency power from the high frequency power supply 18 is applied between the susceptor 11 and the shower head 33.

The shower head 33 at the ceiling portion includes an electrode plate 35 as a bottom surface having a plurality of gas flow openings 34 and an electrode support 36 for detachably supporting the electrode plate 35. Further, a buffer room 37 is formed inside the electrode support 36, and a processing gas inlet line 38 from a processing gas supply unit (not shown) is connected to the buffer room 37. A valve V1 is provided in the processing gas inlet line 38. The valve V1 can block the communication between the buffer room 37 and the processing gas supply unit. In addition, disposed around the chamber 10 are magnets 39 which are annularly or concentrically extended.

In the chamber 10 of the plasma processing apparatus 1, there are formed a horizontal magnetic field directed to one direction by the magnets 39 and a vertical RF electric field by a high frequency voltage applied between the susceptor 11 and the shower head 33, so that a magnetron discharge occurs through the processing gas in the chamber 10, generating a high-density plasma from the processing gas in the vicinity of the top surface of the susceptor 11.

To perform an etching process in the plasma processing apparatus 1, after the gate valve 32 is opened, a wafer W to be processed is loaded in the chamber 10 and mounted on the susceptor 11. Then, a processing gas (e.g., a gaseous mixture of a $C_4F_8$ gas, an $O_2$ gas and an Ar gas at a predetermined flow rate ratio) is introduced into the chamber 10 at a predetermined flow rate and a predetermined flow rate ratio and a pressure in the chamber 10 is maintained at a predetermined value by the APC 14 and the like. Furthermore, a high frequency power from the high frequency power supply 18 is applied to the susceptor 11 and a DC voltage from the DC power supply 22 is applied to the electrode plate 20, thereby generating an electric field, so that the wafer W is attracted and held on the susceptor 11 by the electric field. Further, the processing gas discharged from the shower head 33 is plasmarized as described above. Radicals and/or ions generated in the plasma are converged to the top surface of the wafer W by the focus ring 24 to etch the top surface of the wafer W.

In the aforementioned plasma processing apparatus 1, from the plasma produced, some parts which are not converged to the top surface of the wafer collide with an inner wall of the chamber 10 to generate particles. Some of the generated particles, which are not discharged through the main exhaust line or the rough suction line, are deposited on the top surface of the susceptor 11. The particles deposited on the top surface of the susceptor 11 may be attached to the bottom surface of the wafer W as foreign materials when the wafer W is mounted on the top surface of the susceptor 11. To ameliorate the problem, in the processing apparatus 1, after the etching process has been performed on the wafer W, while the wafer W is lifted by the pusher pins 30 from the top surface of the susceptor 11 to form a space therebetween, a high voltage is applied to the electrode plate 20, an $N_2$ gas is supplied into the space through the thermally conductive gas supply openings 27 and the chamber 10 is exhausted through the rough suction line. In addition, while the inside of the chamber 10 is depressurized by exhaustion through the rough suction line, the processing gas is introduced through the shower head 33 into the chamber 10. In this way, the particles attached to the bottom surface of the wafer W can be removed.

Hereinafter, there will be explained a substrate cleaning method for removing the particles attached to the bottom surface of the wafer W, which is performed in the plasma processing apparatus 1.

Figure 2:
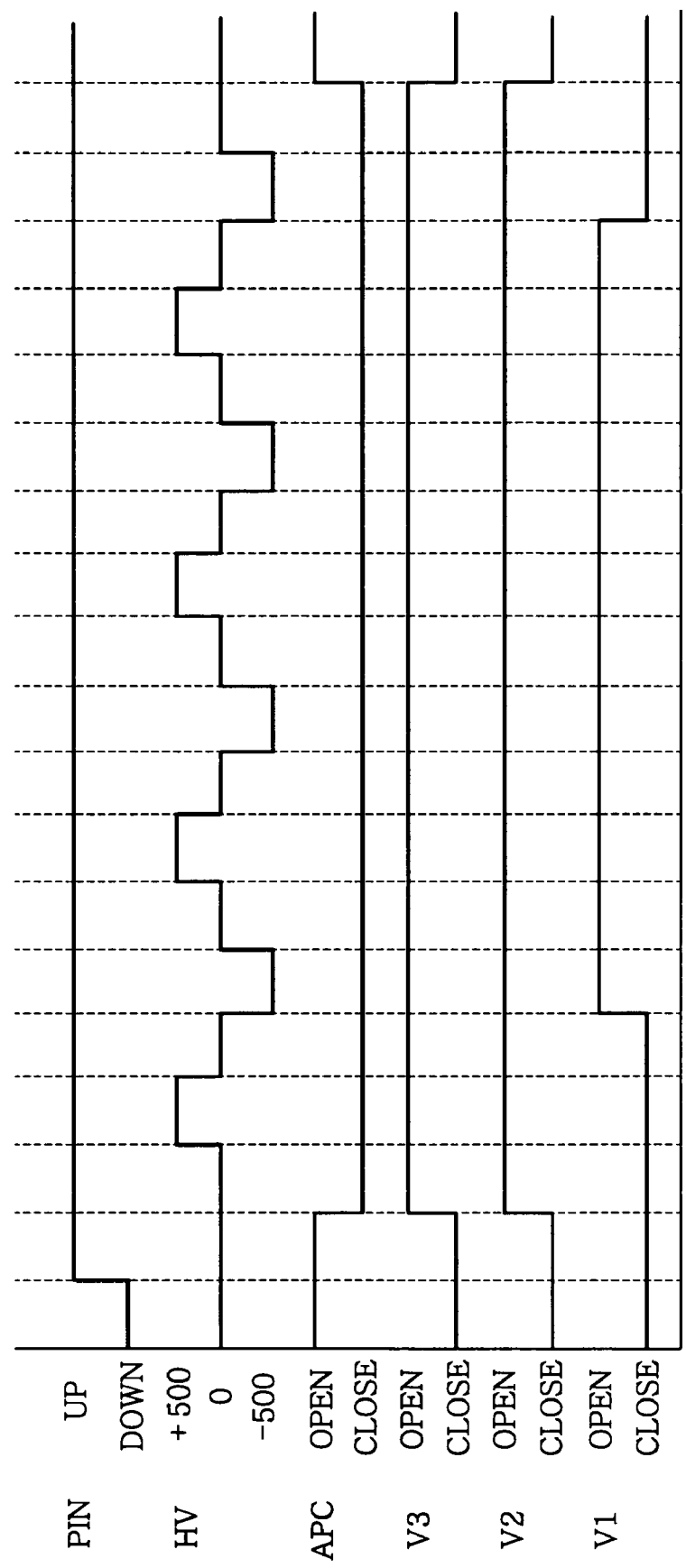
FIG. 2 depicts an operational sequence of the substrate cleaning apparatus performed in the plasma processing apparatus in FIG. 1.

FIG. 2 is a graph showing a sequence of the substrate cleaning process performed in the plasma processing apparatus in FIG. 1. The substrate cleaning process is performed after an etching process has been performed on the wafer W.

In FIG. 2, the substrate cleaning process is performed under the following initial conditions. After having undergone the etching process, the wafer is still mounted on the top surface of the susceptor 11. No voltage is applied to the electrode plate 20 (HV 0). The APC 14 is opened (APC OPEN) and the TMP 15 is actuated. That is, the inside of the chamber 10 is depressurized (vacuum-suctioned) through the main exhaust line and the valves V1~V3 are all closed (V1 CLOSE, V2 CLOSE, V3 CLOSE).

First, the pusher pins 30 accommodated in the susceptor 11 (PIN DOWN) is pushed up to lift and separate the wafer W from the susceptor 11. At this time, there is no particular limitation to the height of the wafer W lifted by the pusher pins 30 from the susceptor 11, but it is preferable to be in a range of 10~20 mm. In this way, there is formed a space S between the top surface of the susceptor 11 and the bottom surface of the wafer W.

Subsequently, the APC 14 is closed (APC CLOSE) and, at the same time, the valve V2 of the exhaust pipe 17 and the valve V3 of the thermally conductive gas feeding pipe 29 are opened (V2 OPEN, V3 OPEN). An $N_2$ gas is then injected through the thermally conductive gas supply openings 27 into the space S toward the bottom surface of the wafer W lifted and the rough suction line exhausts the $N_2$ gas injected into the space S together with the gas remaining in the chamber 10 to the outside thereof. By doing so, there is formed a viscous flow having a high gas viscosity, which flows from the bottom surface of the wafer W toward the periphery of the susceptor 11 in the space S. At this time, if the pressure in the chamber 10 is higher than a predetermined level, the viscous flow is more likely to be formed. To this end, the rough suction line exhausts the $N_2$ gas in the chamber 10 such that the pressure in the chamber 10 is not decreased below the predetermined level, e.g., 133 Pa (1 Torr) and is preferably maintained in a range of, e.g., $1.33\times10^3$~$1.33\times10^4$ Pa (10~100 Torr). In this way, the viscous flow can be surely generated in the space S. The viscous flow captures particles detached from the bottom surface of the wafer W and discharges them together with the gas in the chamber 10 to the outside thereof.

Next, the DC power supply 22 alternately applies to the electrode plate 20 high voltages of different polarities, e.g., +500 V and −500 V (HV +500, HV −500). At this time, due to the high voltage application to the electrode plate 20, an electrostatic field is formed in the chamber 10, particularly in the space S, so that an electrostatic stress, e.g., Maxwell stress, is applied on the bottom surface of the wafer W. Therefore, the adsorptive force attracting the particles to the bottom surface of the wafer W becomes weak and the particles are detached therefrom. The detached particles are discharged out of the chamber 10 from the space S by the viscous flow described above. The electrostatic stress is effectively applied on the bottom surface of the wafer W upon a high voltage application to the electrode plate 20 and a stoppage thereof. Here, in the plasma processing apparatus 1, since the high voltages are repeatedly applied to the electrode plate 20, the effective electrostatic stress is repeatedly applied on the bottom surface of the wafer W. Accordingly, the particles attached to the bottom surface of the wafer W can be more efficiently removed.

A magnitude of the voltage alternately applied to the electrode plate 20 is preferable to be great. For example, it is 500 V or greater and preferably 2 kV or greater. In this way, it is possible to make the electrostatic stress greater, thereby ensuring the detachment of the particles.

Further, if a high voltage of a same polarity is repeatedly applied to the electrode plate 20, the electrode plate 20 will be charged (charged up). As a result, the electrostatic stress being applied on the bottom surface of the wafer W will become small, resulting in deterioration in the removal efficiency of the particles attached to the bottom surface of the wafer W. However, in the plasma processing apparatus 1, since high voltages of different polarities are alternately applied to the electrode plate 20, the electrode plate 20 is not charged, thereby preventing deterioration in the removal efficiency of the particles attached to the bottom surface of the wafer W.

Furthermore, as described above, the effectiveness of the electrostatic stress is substantially related with the number of the application of the high voltage to the electrode plate 20 and not much depends on the duration of the application of the high voltage to the electrode plate 20. Accordingly, the application time of the high voltage to the electrode 20 may be, e.g., 1 sec or less.

While the high voltages of different polarities are kept being alternately applied to the electrode plate 20 as described above, the valve V1 of the processing gas inlet line 38 is opened, and an inactive gas, e.g., an $N_2$ gas, instead of the processing gas, is introduced into the chamber through the shower head 33. At this time, since the inside of the chamber 10 is depressurized by exhaustion through the rough suction line, there occurs a sudden increase in pressure in a portion immediately under the shower head 33, so that the introduced $N_2$ gas generates a traveling shock wave which reaches the lifted wafer W. As a result, an impact force is applied to the wafer W, so that the particles attached to the bottom surface thereof are detached therefrom. Also at this time, the detached particles are discharged by the viscous flow from the space S to outside of the chamber 10.

Moreover, in the plasma processing apparatus 1, in order to effectively increase the pressure immediately under the shower head 33 in the chamber 10 upon the $N_2$ gas introduction, it is preferable that an orifice mechanism, e.g., a mass flow controller or a slow-up valve is not disposed at downstream of the valve V1 in the processing gas inlet line 38.

Further, after the alternate application of the high voltages of different polarities to the electrode plate 20 has been performed a predetermined number of times (e.g., four times in the drawings) under the condition that the valve V1 of the processing gas inlet line 38 is opened (V1 OPEN), the valve V1 of the processing gas inlet line 38 is closed (V1 CLOSE), the APC 14 is opened (APC OPEN) and, at the same time, the valve V2 of the exhaust pipe 17 and the valve V3 of the thermally conductive gas feeding pipe 29 are closed (V2 CLOSE, V3 CLOSE), and the processing is completed.

The wafer, on which the substrate cleaning process described above has been performed, is unloaded from the chamber through the loading/unloading port 31 to a transfer chamber, e.g., a load-lock chamber. However, since the particles attached to the bottom surface of the wafer W are sufficiently removed, the load-lock chamber will not be contaminated by the particles.

In accordance with the substrate cleaning method described above, since high voltages of different polarities are kept being alternately applied to the electrode plate 20 while the space S is formed between the susceptor 11 and the wafer W, an electrostatic field is formed in the space S and an electrostatic stress is applied on the bottom surface of the wafer W. Further, since an $N_2$ gas is introduced into the chamber 10 while the space S is formed and the inside of the chamber 10 is depressurized by exhaustion through the rough suction line, a traveling shock wave is generated in the chamber 10 and an impact force is applied to the wafer W due to the traveling shock wave, so that the particles attached to the bottom surface of the wafer W are detached therefrom into the space S. Therefore, since the detachment of the particles requires no sputtering by ions of the plasma and/or no chemical reaction by radicals, the wafer is not damaged.

An $N_2$ gas is injected through the thermally conductive gas supply openings 27 into the space S and the $N_2$ gas injected into the space S is discharged through the rough suction line to the outside of the chamber 10 while the space S is formed, so that a viscous flow is formed in the space S. The detached particles are captured by the viscous flow to be discharged from the space S to the outside of the chamber 10.

Accordingly, the particles attached to the bottom surface of the wafer W can be sufficiently removed therefrom without damaging the wafer W.

In the aforementioned plasma processing apparatus 1, the $N_2$ gas in the chamber 10 is discharged through the rough suction line while the pressure in the chamber 10 is maintained above a predetermined level. However, by using, instead of the rough suction line, the main exhaust line under the condition that the opening degree of the APC 14 is small, the $N_2$ gas and the like in the chamber 10 may be discharged in a manner that the pressure in the chamber 10 is not decreased below the predetermined level. By doing so, the viscous flow also can be formed in the space S.

Furthermore, the present invention is not limited to the etching processing apparatus, but may be applied to any other plasma processing apparatus including a CVD apparatus, an ashing apparatus and the like.

Hereinafter, there will be described a plasma processing apparatus as a substrate cleaning apparatus in accordance with a second preferred embodiment of the present invention.

The basic configurations and operations of the plasma processing apparatus as the substrate cleaning apparatus in accordance with the second preferred embodiment are substantially identical to those of the first preferred embodiment described above and, therefore, there will be described hereinafter only on different configurations and operations thereof from those of the first embodiment in order to avoid redundant descriptions.

In the plasma processing apparatus as the substrate cleaning apparatus in accordance with the second preferred embodiment, as similarly to the first preferred embodiment, an electrostatic field is formed and an electrostatic stress is applied on the bottom surface of the wafer W while the wafer W is separated by pusher pins 40 to be described later from the top surface of the susceptor 11 to form the space S. However, the second preferred embodiment is different from the first preferred embodiment in that the electrostatic field is formed by applying a high voltage to the wafer W through the pusher pins 40, not to the electrode plate 20.

Figure 3:
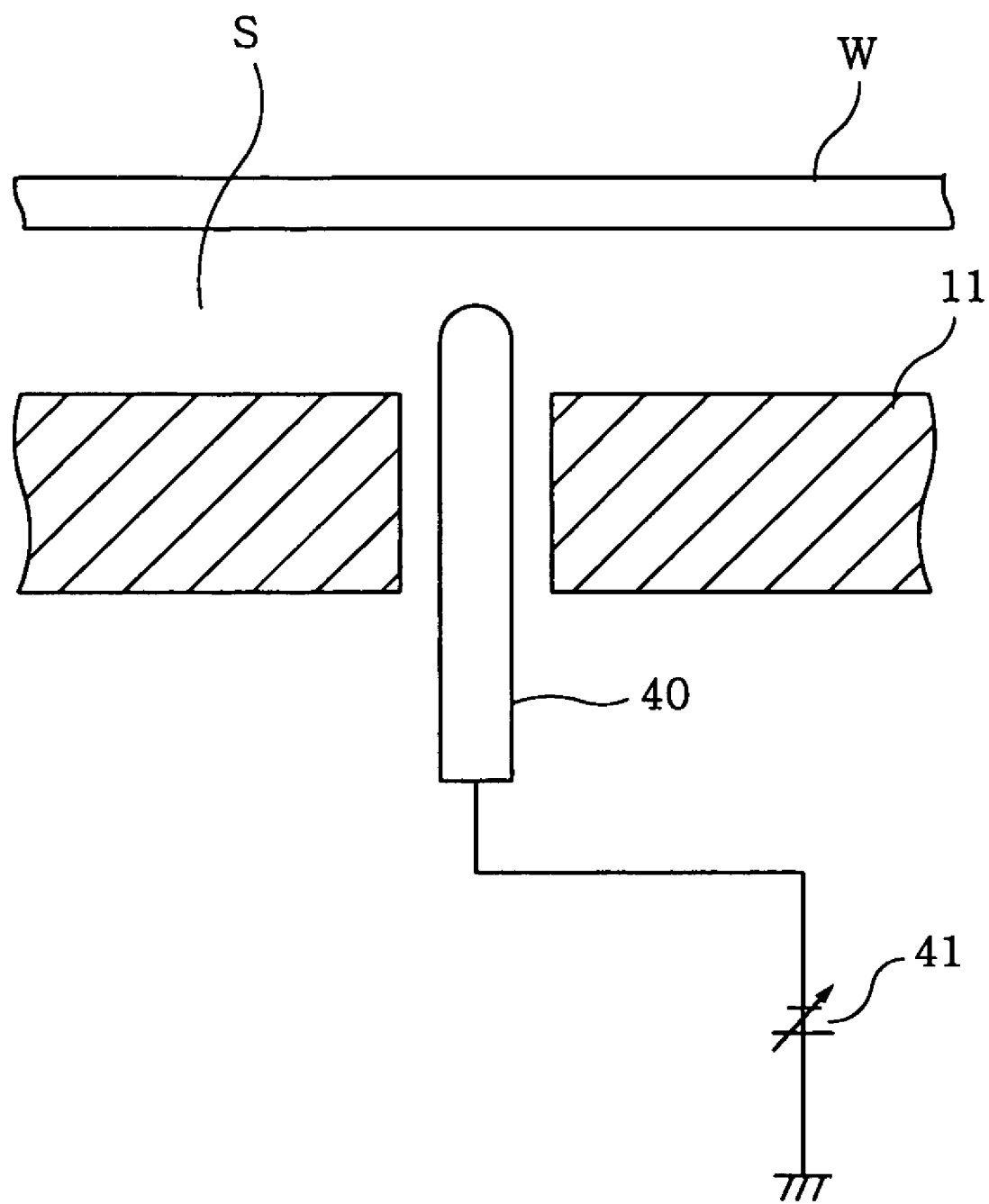
FIG. 3 sets forth a schematic view showing configurations of pusher pins in a plasma processing apparatus as a substrate cleaning apparatus in accordance with a second preferred embodiment of the present invention.

FIG. 3 is a schematic view showing configurations of the pusher pins in the plasma processing apparatus as the substrate cleaning apparatus in accordance with the second preferred embodiment.

In FIG. 3, the pusher pin 40 is a rod-shaped body made of a conductive material. One end of the pusher pin 40, which comes to contact with the bottom surface of the wafer W, has a semi-spherical shape and the other end is electrically connected to a DC power supply 41. Further, the surface of the pusher pin 40 is preferably coated with, e.g., a dielectric material in order to prevent a discharge from the surface, but at the semi-spherical end, the conductive material is exposed for a high voltage application to the wafer W. The pusher pin 40 can be moved in a vertical direction in the drawing by converting the rotation of a motor (not shown) into a linear movement through, e.g., a ball screw.

A plurality of pusher pins 40 is disposed in a portion in the top surface of the susceptor 11 where the wafer W is attracted and held. The pusher pins 40 protrude from the top surface of the susceptor 11 to lift and separate the wafer W from the susceptor 11. At this time, as similarly to the first preferred embodiment, a space S is formed between the top surface of the susceptor 11 and the bottom surface of the wafer W.

In the plasma processing apparatus as the substrate cleaning apparatus in accordance with the second preferred embodiment, while the wafer is separated by the pusher pins 40 from the susceptor 11 to form the space S after an etching process has been performed on the wafer W, a high voltage is applied from the DC power supply 41 via the pusher pins 40 to the wafer W. At the same time, an $N_2$ gas and the like is supplied through the thermally conductive gas supply openings 27 into the space S and the chamber 10 is evacuated by exhaustion through the rough suction line. Further, a processing gas is introduced into the chamber 10 through the shower head 33 while the inside of the chamber 10 is depressurized by exhaustion through the rough suction line.

In addition, a substrate cleaning method performed in the plasma processing apparatus as the substrate cleaning apparatus in accordance with the second preferred embodiment is different from that of the first preferred embodiment in that high voltages of different polarities are kept being alternately applied via the pusher pins 40 to the wafer in lieu of the electrode plate 20. However, they are same in that an electrostatic field is formed in the space S and an electrostatic stress is applied on the bottom surface of the wafer W, thereby making the adsorptive force adsorbing the particles to the bottom surface of the wafer W weak and allowing the particles to be detached therefrom.

Furthermore, as similarly to the first preferred embodiment, the magnitude of the high voltage applied to the wafer W via the pusher pins 40 is, e.g., 500 V or greater, preferably 2 kV or greater and the application time of the high voltage may be, e.g., 1 sec or less.

In accordance with the substrate cleaning method, since the high voltages of the different polarities are kept being alternately applied to the wafer W via the pusher pin 40 while the space S is formed between the susceptor 11 and the wafer W, an electrostatic field is formed in the space S and an electrostatic stress is applied on the bottom surface of the wafer W. Further, since an $N_2$ gas is introduced into the chamber 10 while the space S is formed and the inside of the chamber 10 is depressurized by exhaustion through the rough suction line, a traveling shock wave is generated in the chamber 10 and an impact force is applied to the wafer W due to the generated traveling shock wave. As a result, the particles attached to the bottom surface of the wafer W are detached therefrom into the space S. Therefore, since the detachment of the particles requires no sputtering by ions of the plasma and no chemical reaction by radicals, the wafer is not damaged.

An $N_2$ gas is injected through the thermally conductive gas supply openings 27 into the space S and the $N_2$ gas injected into the space S is discharged through the rough suction line to the outside of the chamber 10 while the space S is formed, so that a viscous flow is formed in the space S. The detached particles are captured by the viscous flow to be discharged from the space S to the outside of the chamber 10.

Accordingly, the particles attached to the bottom surface of the wafer W can be sufficiently removed therefrom without damaging the wafer W.

Hereinafter, there will be described a substrate cleaning apparatus in accordance with a third preferred embodiment of the present invention.

The substrate cleaning apparatus of the third preferred embodiment is different from those of the first and the second preferred embodiment in that only a cleaning is performed on the bottom surface of the wafer W without performing any plasma processing.

Figure 4:
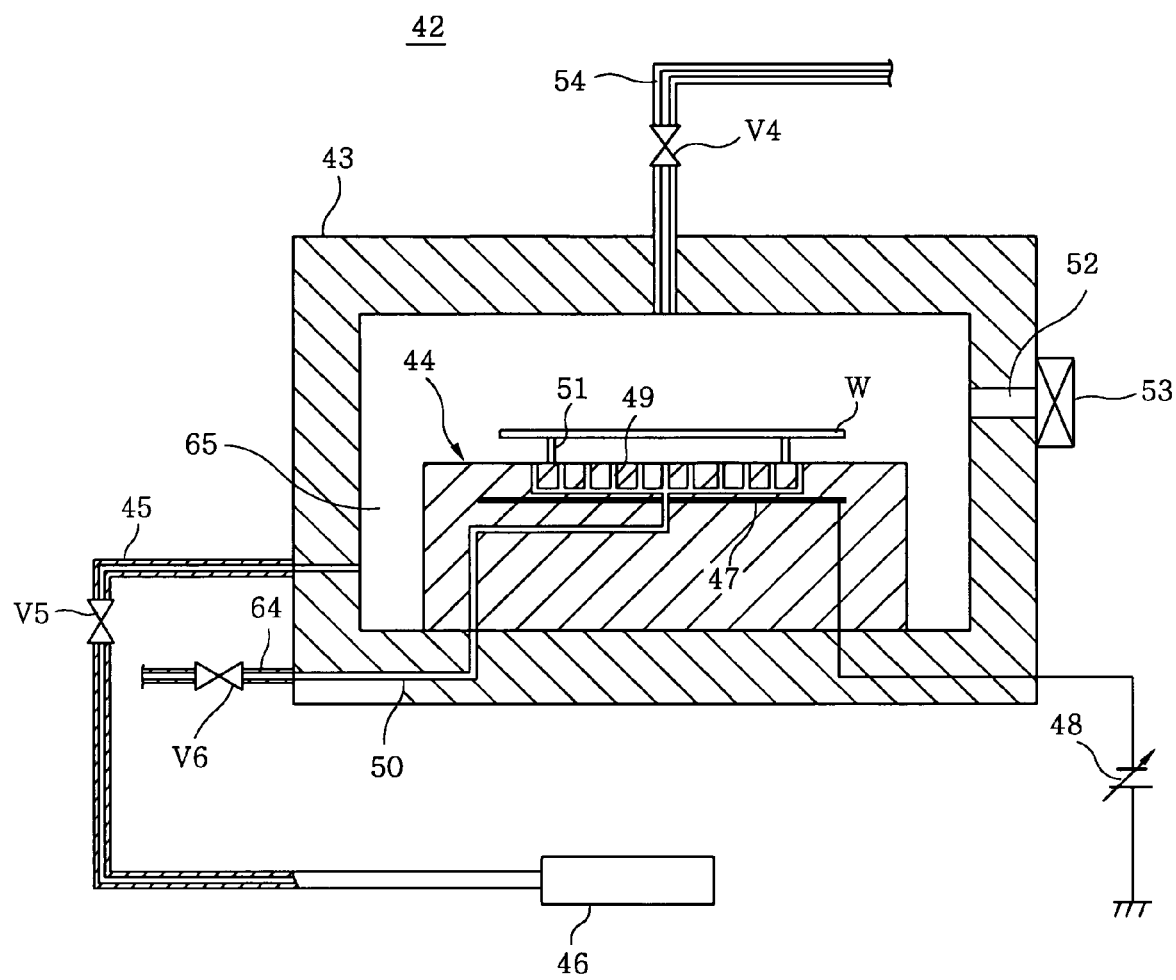
FIG. 4 presents a cross sectional view schematically showing configurations of a substrate cleaning apparatus in accordance with a third preferred embodiment of the present invention.

FIG. 4 is a cross sectional view schematically showing configurations of the substrate cleaning apparatus in accordance with the third preferred embodiment of the present invention.

In FIG. 4, the substrate cleaning apparatus 42 includes a box-shaped chamber 43 made of a metal, e.g., aluminum or stainless steel, and there is provided in the chamber 43 a columnar stage 44 on which the wafer W is mounted.

Formed between a sidewall of the chamber 43 and the stage 44 is an exhaust passageway 65 serving as a flow passage through which a gas above the stage 44 is discharged to the outside of the chamber 43. The exhaust passageway 65 is connected to a rough suction line. The rough suction line includes an exhaust pipe 45 having a diameter of, e.g., 25 mm which allows the exhaust passageway 65 to communicate with a DP 46 that is an exhausting pump, and a valve V5 disposed in the exhaust pipe 45. The valve V5 can block the communication between the exhaust passageway 65 and the DP 46. A gas in the chamber 43 is discharged through the rough suction line by using DP 46.

Disposed at an upper portion in the stage 44 is a disc-shaped electrode plate 47 made of a conductive film for attracting and holding the wafer W by using an electrostatic adsorptive force. A DC power supply 48 is electrically connected to the electrode plate 47.

A plurality of gas supply openings 49 is opened in a portion of the top surface of the stage 44 on which the wafer W is attracted and held. The gas supply openings 49 communicate via a gas supply line 50 provided in the stage 44 with a gas feeding pipe 64 having a valve V6, and a gas, e.g., an $N_2$ gas from a first gas supply unit (not shown) connected to the gas feeding pipe 64 is supplied into a gap between the top surface of the stage 44 and the bottom surface of the wafer W. Further, the valve V6 can block the communication between the gas supply openings 49 and the first gas supply unit.

Further, at the portion of the top surface of the stage 44 on which the wafer W is attracted and held, a plurality of pins 51 are disposed to protrude from the top surface of the stage 44. The pins 51 lift the wafer W loaded in the chamber 43 to make it separated from the stage 44. At this time, there is formed a space S between the top surface of the stage 44 and the bottom surface of the wafer W. The pins 51 may be constructed to move vertically as similar to the pusher pins 30.

At a sidewall of the chamber 43, there is provided a gate valve 53 for opening and closing a loading/unloading port 52 for the wafer W. Furthermore, connected to a ceiling portion of the chamber 43 is a gas inlet line 54 for introducing a gas, e.g., an $N_2$ gas, from a second gas supply unit (not shown). A valve V4 is provided in the gas inlet line 38. The valve V4 can block the communication between the inside of the chamber 43 and the second gas supply unit.

The substrate cleaning apparatus 42 is installed in, e.g., a parallel type substrate processing system and removes particles attached to the bottom surface of the wafer W on which a plasma process has been performed by a plasma processing apparatus 56 to be described later included in the substrate processing system.

Figure 5:
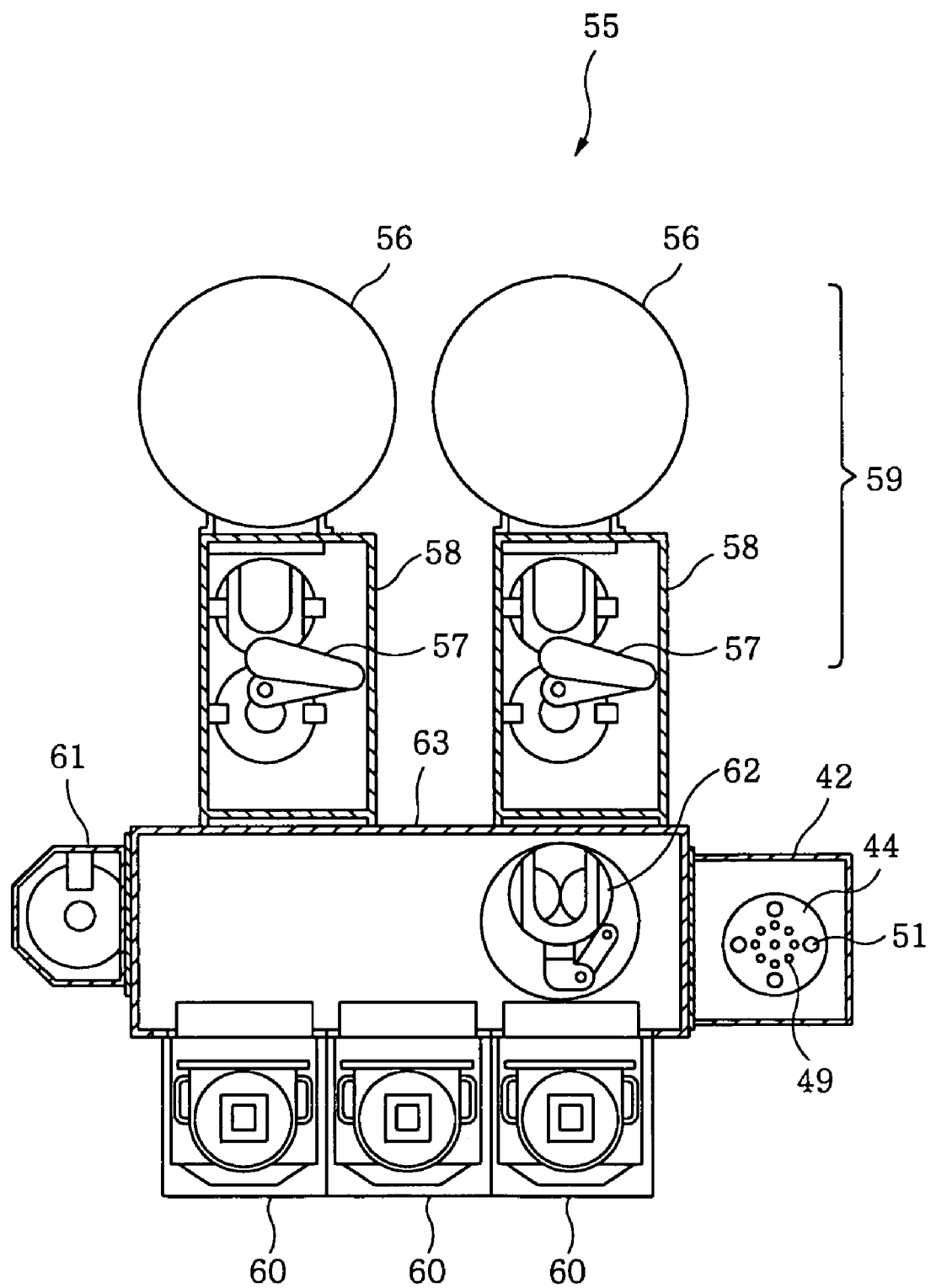
FIG. 5 describes a schematic view showing configurations of a substrate processing system including the substrate cleaning apparatus in FIG. 4.

FIG. 5 is a schematic view showing configurations of the substrate processing system in which the substrate cleaning apparatus is installed.

In FIG. 5, the substrate processing system 55 includes a process ship 59 comprised of a plasma processing apparatus 56 for performing an etching process on a wafer W and a load-lock chamber 58 wherein a link-shaped single pick type transfer arm 57 for loading and unloading the wafer W to and from the plasma processing apparatus 56 is installed; a loading boat 60 for accommodating a carrier box containing therein one lot of wafers W; an orienter for pre-aligning the wafer W; the above-described substrate cleaning apparatus 42; and a loader module 63, as a rectangular common transferring passageway, in which a scalar dual-arm type transfer arm 62 is installed. The process ship 59, the loading boat 60, the orienter 61 and the substrate cleaning apparatus 42 are detachably connected to the loader module 63, wherein the substrate cleaning apparatus 42 is installed, opposite via the loader module 63 to the orienter 61, at one end of the loading module 63 in a longitudinal direction thereof.

In the substrate processing system 55, the wafer W subject to a plasma processing in the plasma processing apparatus 56 is loaded in the substrate cleaning apparatus 42 by using the transfer arm 57 in the load-lock chamber 58 and the transfer arm 62 in the loader module 63. The substrate cleaning apparatus 42 removes particles attached to the bottom surface of the wafer W by performing a substrate cleaning process to be described later.

Hereinafter, there will be described the substrate cleaning process performed in the substrate cleaning apparatus 42.

The substrate cleaning process is performed under the following initial conditions. After having undergone an etching process, the wafer W is still mounted on the top surface of the stage 44. No voltage is applied to the electrode plate 47. The valves V4~V6 are all closed.

First, the wafer W loaded into the chamber 43 is mounted on the pins 51 protruding from the top surface of the stage 44. At this time, the height of the wafer W lifted by the pins 51 from the stage 44 is preferably to be 10~20 mm as similar to the first preferred embodiment. In this way, there is formed a space S between the top surface of the stage 44 and the bottom surface of the wafer W.

Subsequently, the gate valve 53 is closed and, at the same time, the valve V5 of the exhaust pipe 45 and the valve V6 of the gas feeding pipe 64 are opened. An $N_2$ gas is then injected through the gas supply openings 49 into the space S toward the bottom surface of the wafer W lifted and the $N_2$ gas injected into the space S is exhausted through the rough suction line out of the chamber 43. By doing so, there is formed a viscous flow of the $N_2$ gas, which flows from the bottom surface of the wafer W toward the periphery of the stage 44 in the space S. At this time, the $N_2$ gas in the chamber 43 is preferably exhausted through the rough exhaust line such that the pressure in the chamber 43 is not decreased below a predetermined level. The viscous flow captures particles detached from the bottom surface of the wafer W and discharges them out of the chamber 10.

Next, the DC power supply 48 is kept being alternately applied to the electrode plate 47 high voltages of different polarities. At this time, as similarly to the first preferred embodiment, an electrostatic field is formed in the space S and an electrostatic stress is applied on the bottom surface of the wafer W. Therefore, the adsorptive force attracting the particles to be adsorbed to the bottom surface of the wafer W becomes weak, so that the particles are detached therefrom. Further, the detached particles are discharged out of the chamber 43 from the space S by the viscous flow described above.

As similarly to the first preferred embodiment, the magnitude of the high voltage applied to the electrode plate 20 is, e.g., 500 V or greater, preferably 2 kV or greater and the application time of the high voltage may be, e.g., 1 sec or less.

While the high voltages of different polarities are alternately applied to the electrode plate 20 as described above, the valve V4 of the gas inlet line 54 is opened and an $N_2$ gas is introduced into the chamber 43 from the gas inlet line 54. At this time, as similarly to the first preferred embodiment, since the inside of the chamber 10 is depressurized by exhaustion through the rough suction line, the pressure in a portion immediately under a ceiling portion of the chamber 43 is suddenly increased, so that the introduced $N_2$ gas generates a traveling shock wave and the generated traveling shock wave applies an impact force to the wafer. As a result, the particles attached to the bottom surface thereof are detached therefrom. At this time, the detached particles are also discharged by the viscous flow from the space S to outside of the chamber 43. In the substrate cleaning apparatus 42, as similar to the first preferred embodiment, it is preferable that no orifice mechanism is installed at downstream of the valve V4 in the gas inlet line 54.

Further, after the alternate application of the high voltages of different polarities to the electrode plate 20 has been performed a predetermined number of times under the condition that the valve V4 of the gas inlet line 54 is opened, the valve V4 of the gas inlet line 54, the valve V5 of the exhaust pipe 45 and the valve V6 of the gas feeding pipe 64 are closed and the processing is completed. The wafer W which has been subject to the substrate cleaning process described above is unloaded from the chamber 43 through the loading/unloading port 52 and loaded into the loader module 63 or the loading boat 60. However, since the particles attached to the bottom surface of the wafer W are sufficiently removed, the load-lock chamber will not be contaminated by the particles.

In accordance with the substrate cleaning method described above, since high voltages of different polarities are kept being alternately applied to the wafer W while the space S is formed between the stage 44 and the wafer W, an electrostatic field is formed in the space S and an electrostatic stress is applied on the bottom surface of the wafer W. Further, an $N_2$ gas is introduced into the chamber 43 while the space S is formed and the inside of the chamber 43 is depressurized by exhaustion through the rough suction line, so that a traveling shock wave is generated in the chamber 43 and an impact force is applied to the wafer W due to the traveling shock wave. As a result the particles attached to the bottom surface of the wafer W are detached therefrom into the space S. Therefore, since the detachment of the particles requires no sputtering by ions of the plasma and no chemical reaction by radicals, the wafer is not damaged.

An $N_2$ gas is injected through the thermally conductive gas supply openings 27 into the space S and the $N_2$ gas injected into the space S is discharged through the rough suction line to the outside of the chamber 10 while the space S is formed, so that a viscous flow is formed in the space S. The detached particles are captured by the viscous flow to be discharged from the space S to the outside of the chamber 43.

Accordingly, the particles attached to the bottom surface of the wafer W can be sufficiently removed therefrom without damaging the wafer W.

In the aforementioned plasma processing apparatus 42, although the substrate cleaning apparatus 42 exclusively includes the DP 46, the substrate cleaning apparatus 42 and the plasma processing apparatus 56 may commonly use the DP. In this case, the configurations of the substrate processing system may be simplified.

In the above preferred embodiment, although there have been described a case where the plasma processing apparatus serves as a substrate cleaning apparatus and a case where an exclusive substrate cleaning apparatus is provided, other apparatus included in the substrate cleaning system may serve as the substrate cleaning apparatus in accordance with the present invention.

For example, in case the load-lock chamber serves as the substrate cleaning apparatus in accordance with the present invention, the load-lock chamber includes a transfer arm, an exhaust unit for exhausting the inside of the load-lock chamber, and a gas introduction unit for introducing a gas into the load-lock chamber. Preferably, the transfer arm has pins protruding from a wafer mounting surface, an electrode for generating an electrostatic field between a wafer W and the wafer mounting surface, and a gas injection unit for injecting a gas toward the bottom surface of the wafer. In the load-lock chamber, while the wafer W is lifted by the pins from the wafer mounting surface to form a space S, a high voltage is applied to the electrode, a gas is injected toward the bottom surface of the wafer W and the load-lock chamber is evacuated by the exhaust unit. Further, a gas is introduced into the load-lock chamber from the gas introduction unit while the inside of the load-lock chamber is depressurized by the exhaust unit.

EXPERIMENTAL EXAMPLE

Hereinafter, an experimental example of the present invention will be described.

The following example was performed in the plasma processing apparatus 1 described above.

First, after preparing a wafer W whose bottom surface had a multiplicity of particles attached thereto, the wafer W was mounted on the pusher pins 30 protruding from the susceptor 11 in the chamber 10.

Further, after the inside of the chamber 10 was depressurized by using the main exhaust line, the APC 14 was closed and the valve V2 of the exhaust pipe 17 and the valve V3 of the thermally conductive gas feeding pipe 29 were opened. Under the above condition, an $N_2$ gas was injected through the thermally conductive gas supply openings 27 toward the bottom surface of the wafer W while slowly exhausting the inside of the chamber 10. By doing so, there was formed a viscous flow in the space S while maintaining the pressure in the chamber 10 at $6.65 \times 10^3$ Pa (50 Torr) or above.

Subsequently, by opening the valve V1, the $N_2$ gas was introduced into the chamber 10 at a flow rate of $7.0 \times 10^4$ sccm. Voltages of +2 kV and −2 kV were alternately applied to the electrode plate 20 six times while the valve V1 was opened, and the valve V1 was then closed. Furthermore, by opening the valve V1 again, the $N_2$ gas was introduced into the chamber 10 at a flow rate of $7.0 \times 10^4$ sccm. Voltages of +2 kV and −2 kV were alternately applied to the electrode plate 20 five times while the valve V1 was opened, and the valve V1 was then closed. At that time, after irradiating a laser beam to the space S, scattered lights generated by the particles were observed by photographing them with a CCD camera. Status of the scattered lights photographed is illustrated in FIGS. 6A to 6C.

Figure 6A:
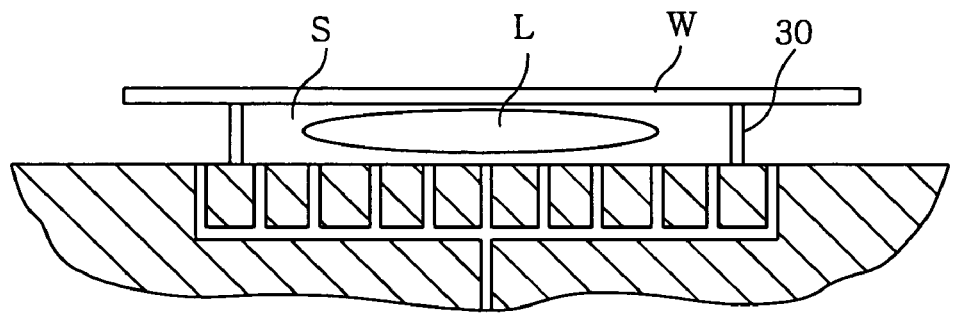
FIG. 6A provides a diagram schematically showing a status of a space S in a case where voltages of +2 kV and −2 kV are alternately applied to an electrode plate repeatedly while a valve V1 is opened.

FIG. 6A is a diagram schematically showing the status of the space S in a case where the voltages of +2 kV and −2 kV were alternately applied to the electrode plate 20 repeatedly while the valve V1 was opened. In FIG. 6A, it was observed that a large number of particles were detached from the bottom surface due to the traveling shock wave generated by the introduced $N_2$ gas and the electrostatic stress generated by the alternate application of the voltages and the detached particles formed a group L.

Figure 6B:
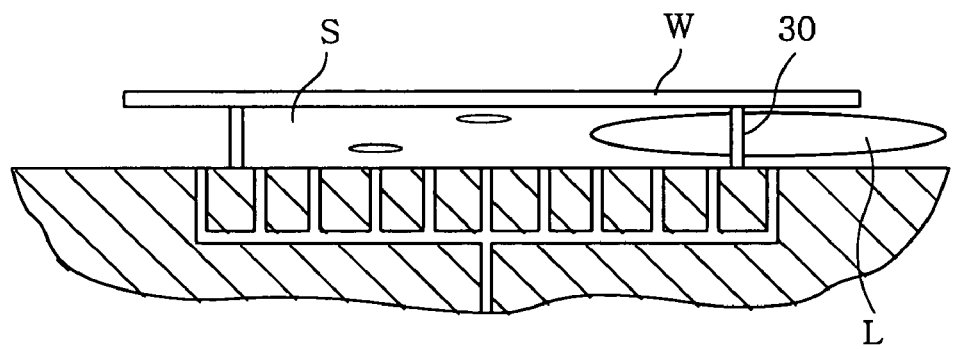
FIG. 6B represents a diagram schematically showing the status of the space S after a few seconds have elapsed from the time corresponding to the status shown in FIG. 6A.

FIG. 6B is a diagram schematically showing the status of the space S after a few seconds had elapsed from the time corresponding to the status of FIG. 6A. In FIG. 6B, it was observed that the group L of the particles was being removed from the space S by the viscous flow flowing from the bottom surface of the wafer W toward the periphery of the susceptor 11 in the space S.

Figure 6C:
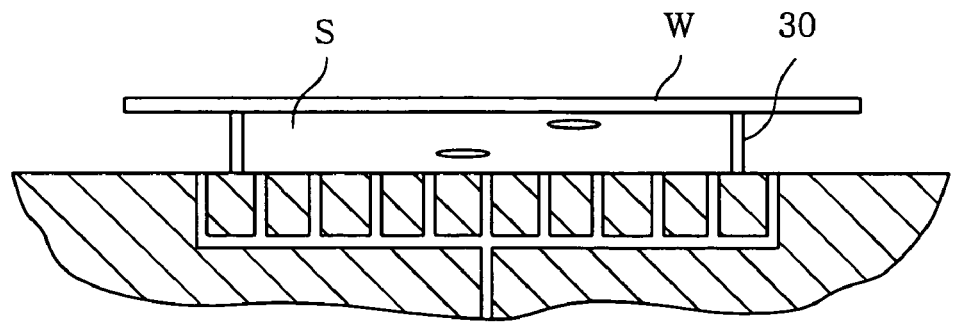
FIG. 6C sets forth a diagram schematically showing the status of the space S after a few seconds have elapsed from the time corresponding to the status shown in FIG. 6B.

FIG. 6C is a diagram schematically showing the status of the space S after a few seconds had elapsed from the time corresponding to the status of FIG. 6B. In FIG. 6C, it was observed that the group L of the particles was completely removed from the space S.

Figure 7:
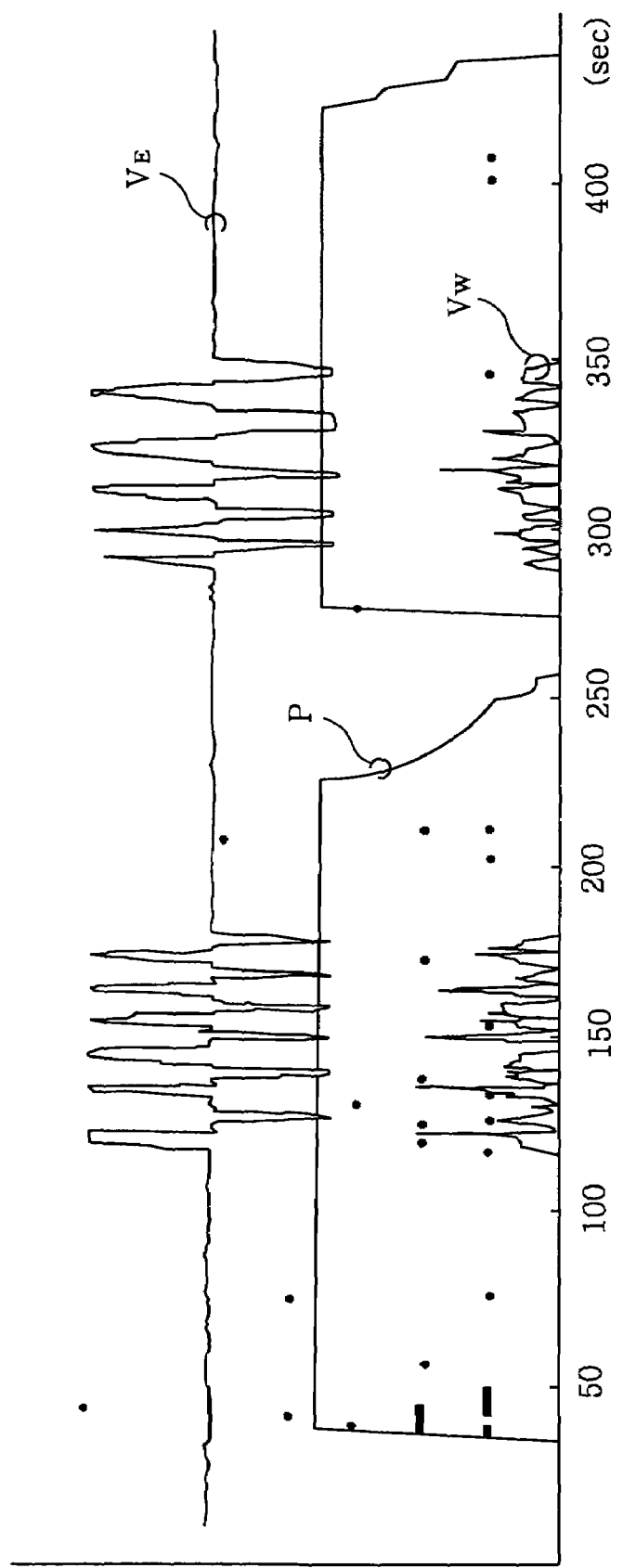
FIG. 7 depicts a graph showing observation results of removed particles in an experimental example of the present invention.
Figure 8:
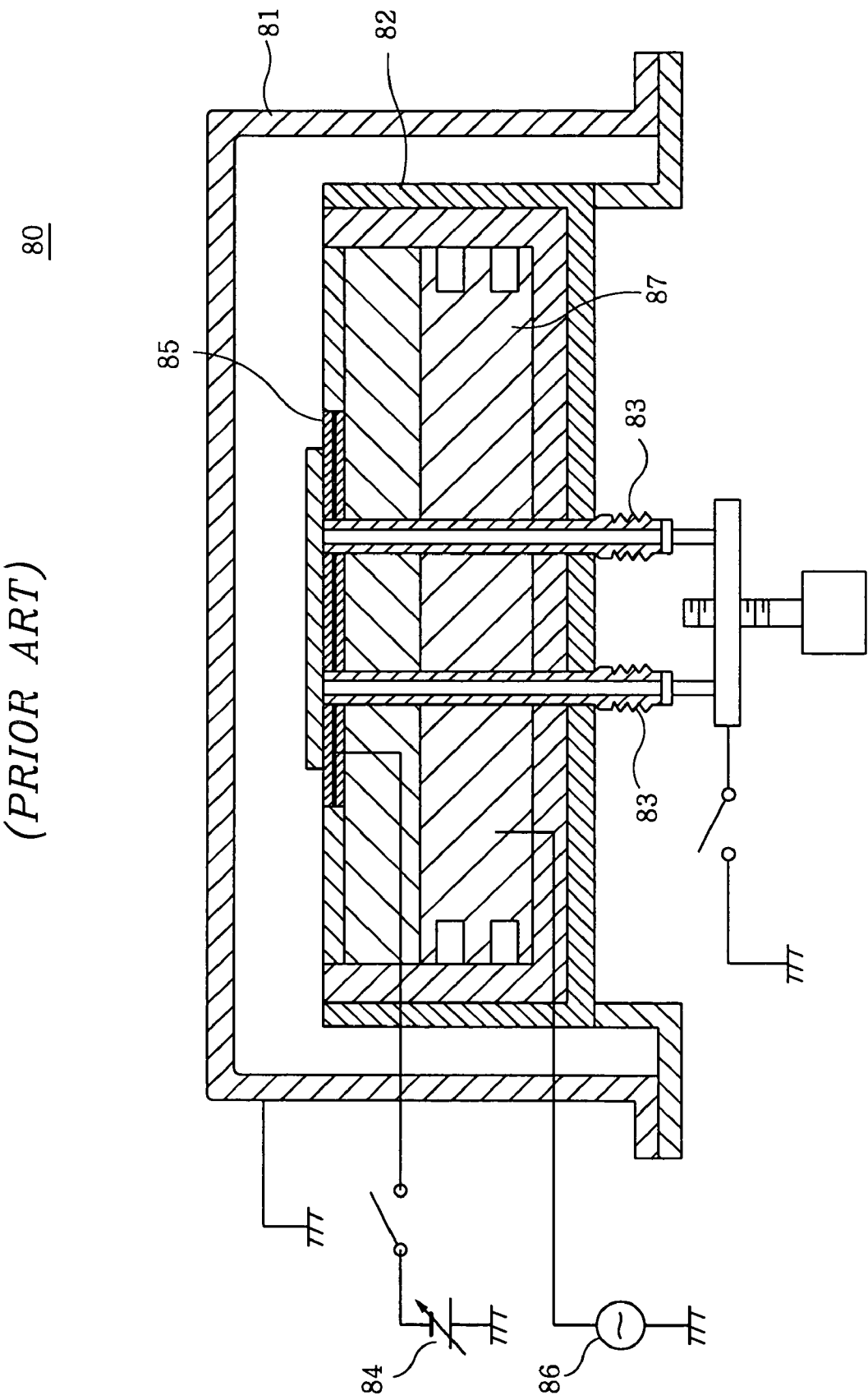
FIG. 8 is a schematic view showing a configuration of a conventional plasma processing apparatus for performing an etching process on a wafer W.

The observation results were illustrated in a graph of FIG. 7.

In FIG. 7, the horizontal axis represents time and the vertical axis presents the number of particles, voltage value and pressure value. Further, $V_E$ represents a voltage applied to the electrode plate 20, $V_W$ presents a voltage induced in the wafer W by $V_E$, and P indicates a pressure in the chamber 10. In addition, each point plotted in the drawing indicates the number of particles observed at each observation time. Moreover, the portions where the value of P is constant are those where the pressure in the chamber 10 exceeds a measurable range.

As can be seen from FIG. 7, a number of particles were detached from the bottom surface of the wafer W by the traveling shock wave generated immediately after a great amount of $N_2$ gas was introduced into the chamber by opening the valve V1, and more particles were detached therefrom by the alternate application of voltages to the electrode plate 20 being repeated. Therefore, it was appreciated that the introduction of a great amount of $N_2$ gas into the chamber 10 and the repetition of the alternate application of voltages can sufficiently detach the particles attached to the bottom surface of the wafer W. Furthermore, in the second introduction of a great amount of $N_2$ gas into the chamber 10 accompanied with another repetition of the alternate application of voltages, it was observed that the amount of the particles detached from the bottom surface of the wafer W was substantially decreased, so that it was appreciated that the particles could be effectively detached from the bottom surface of the wafer W by performing just once the introduction of a great amount of $N_2$ gas into the chamber 10 and the repetition of the alternate application of voltage.

Moreover, as a result of observing the particles discharged from the chamber 10 through the rough suction line by using a particle monitoring method employing a laser scattering method, there were obtained same observation results as those in FIG. 7. Accordingly, it was understood that the viscous flow could effectively discharge the detached particles from the chamber 10.

While the invention has been shown and described with respect to the preferred embodiments, it will be understood by those skilled in the art that various changes and modification may be made without departing from the spirit and scope of the invention as defined in the following claims.

What is claimed is:

1. A substrate cleaning method for removing foreign materials attached to a bottom surface of a substrate, the method comprising the steps of:
   accommodating the substrate in a chamber;
   mounting the substrate on a mounting table disposed in the chamber;
   separating the substrate from the mounting table to form a space therebetween;
   applying a voltage from a power supply to an electrode disposed in the mounting table while the space is formed, the power supply being connected to the electrode;
   supplying a gas into the space while the space is formed; and
   exhausting the inside of the chamber while the space is formed to thereby remove the foreign materials attached to the bottom surface of the substrate,
   wherein the step of supplying the gas comprises supplying the gas into the space toward a bottom surface of the substrate through gas supply openings provided on a top surface of the mounting table, and
   wherein the applied voltage forms an electrostatic field in the space so that an electrostatic stress is applied on the bottom surface of the substrate to thereby detach the foreign materials from the bottom surface.

2. The method of claim 1, further comprising the step of performing, while applying a DC voltage from the power supply to the electrode to hold the substrate on the mounting table, plasma processing on the substrate using a plasma generated by using a high frequency power supply electrically connected to the mounting table.

3. The method of claim 2, wherein after the plasma processing step is completed, applying the voltage from the power supply to the electrode is stopped, and then the step of separating and the substrate is performed.

4. The method of claim 1, further comprising the step of introducing a gas into the chamber while the chamber is depressurized and the space is formed.

5. The method of claim 4, wherein, during the exhausting step, the pressure inside the chamber is maintained at 133 Pa or greater.

6. The method of claim 5, wherein, during the exhausting step, the pressure inside the chamber is maintained in the range from $1.33 \times 10^3$ to $1.33 \times 10^4$ Pa.

7. The method of claim 1, wherein at the voltage applying step, the voltage is discontinuously applied to the electrode.

8. The method of claim 7, wherein at the voltage applying step, voltages of different polarities are alternately applied to the electrode.

9. The method of claim 8, wherein a magnitude of the voltages is 500 V or greater.

10. The method of claim 9, wherein the magnitude of the voltages is 2 kV or greater.

11. A substrate cleaning method for removing foreign materials attached to a bottom surface of a substrate, the method comprising the steps of:
    accommodating the substrate in a chamber;
    mounting the substrate on a mounting table disposed in the chamber;
    separating the substrate from the mounting table to form a space therebetween;
    applying a voltage from a power supply to the substrate while the space is formed;
    supplying a gas into the space while the space is formed;
    exhausting the inside of the chamber while the space is formed; and
    introducing a gas into the chamber while the chamber is depressurized and the space is formed,
    wherein at the gas supplying step, the gas is supplied into the space toward a bottom surface of the substrate through gas supply openings provided on a top surface of the mounting table, and
    wherein the applied voltage forms an electrostatic field in the space so that an electrostatic stress is applied on the bottom surface of the substrate to thereby detach the foreign materials from the bottom surface.

12. The method of claim 11, wherein at the step of separating the substrate, the substrate is lifted by pusher pins to form the space, the pusher pins being electrically connected to the power supply, and
    wherein at the voltage applying step, the voltage from the power supply is applied through the pusher pins to the lifted substrate.

* * * * *